United States Patent [19]

Holmes et al.

[11] Patent Number: 5,296,813
[45] Date of Patent: Mar. 22, 1994

[54] MAGNETIC RESONANCE SCANNER WITH IMPROVED PACKAGING FOR CIRCUITRY WITHIN THE MAGNETIC FIELD

[75] Inventors: Timothy B. Holmes, Solon; Paul M. Scsavnicki, Mentor, both of Ohio

[73] Assignee: Picker International, Inc., Highland Heights, Ohio

[21] Appl. No.: 847,796

[22] Filed: Mar. 5, 1992

[51] Int. Cl.⁵ ............................................. G01V 3/00
[52] U.S. Cl. .................... 324/322; 324/318; 128/653.5
[58] Field of Search ............... 324/300, 312, 313, 318, 324/320, 322; 128/653.5

[56] References Cited

U.S. PATENT DOCUMENTS

| | | | |
|---|---|---|---|
| 4,721,913 | 1/1988 | Hyde et al. | 324/318 |
| 4,816,765 | 3/1989 | Boskamp | 324/318 |
| 4,918,388 | 4/1990 | Mehdizadeh et al. | 324/322 |
| 4,920,318 | 4/1990 | Misic et al. | 324/322 |
| 5,076,275 | 12/1991 | Bechor et al. | 324/318 |

OTHER PUBLICATIONS

"Electronic Packaging, Microelectronics, and Interconnection Dictionary", Harper, et al., McGraw-Hill, Inc. Copyright 1993, pp. 30-31, 37, 54, 57-58, 61, 97-98, 103, 138-139, 190-191, and 213 (month unknown).
"High Temperature Packaging: Flip Chip on Flexible Laminate", Surface Mount Technology, Jan. 1992, vol. 6, No. 1.

*Primary Examiner*—Louis Arana
*Attorney, Agent, or Firm*—Fay, Sharpe, Beall, Fagan, Minnich & McKee

[57] ABSTRACT

A magnetic resonance imaging apparatus defines an examination region (14) within which main magnets (10) create a uniform magnetic field. Magnetic resonance is excited in dipoles of a subject within the examination region causing the generation of magnetic resonance signals which are received by a localized coil (C). Because the localized coil is disposed within the examination region, the localized coil, particularly a magnetic resonance processing circuit (54) mounted on the coil is free of ferrous materials, such as iron and nickel, to prevent distortion of the uniform magnetic field. The circuit includes an array of component dice which are free of ferrous or other packaging. The dice are adhesively bonded to a substrate (62) and connected by whiskers (82) with electrically conductive lead lines (60) on the substrate. In one embodiment, the component dice include a transistor (Q1) and other circuit components for amplifying the received resonance signal. In another embodiment, a collection of component dice are connected by the lead lines with contact points (70). By selectively interconnecting the contact points, the same package can be used for a variety of applications and purposes. In this manner, a "universal" package is provided which can be manufactured in bulk and readily adapted to a variety of applications in or close to the uniform magnetic field.

16 Claims, 4 Drawing Sheets

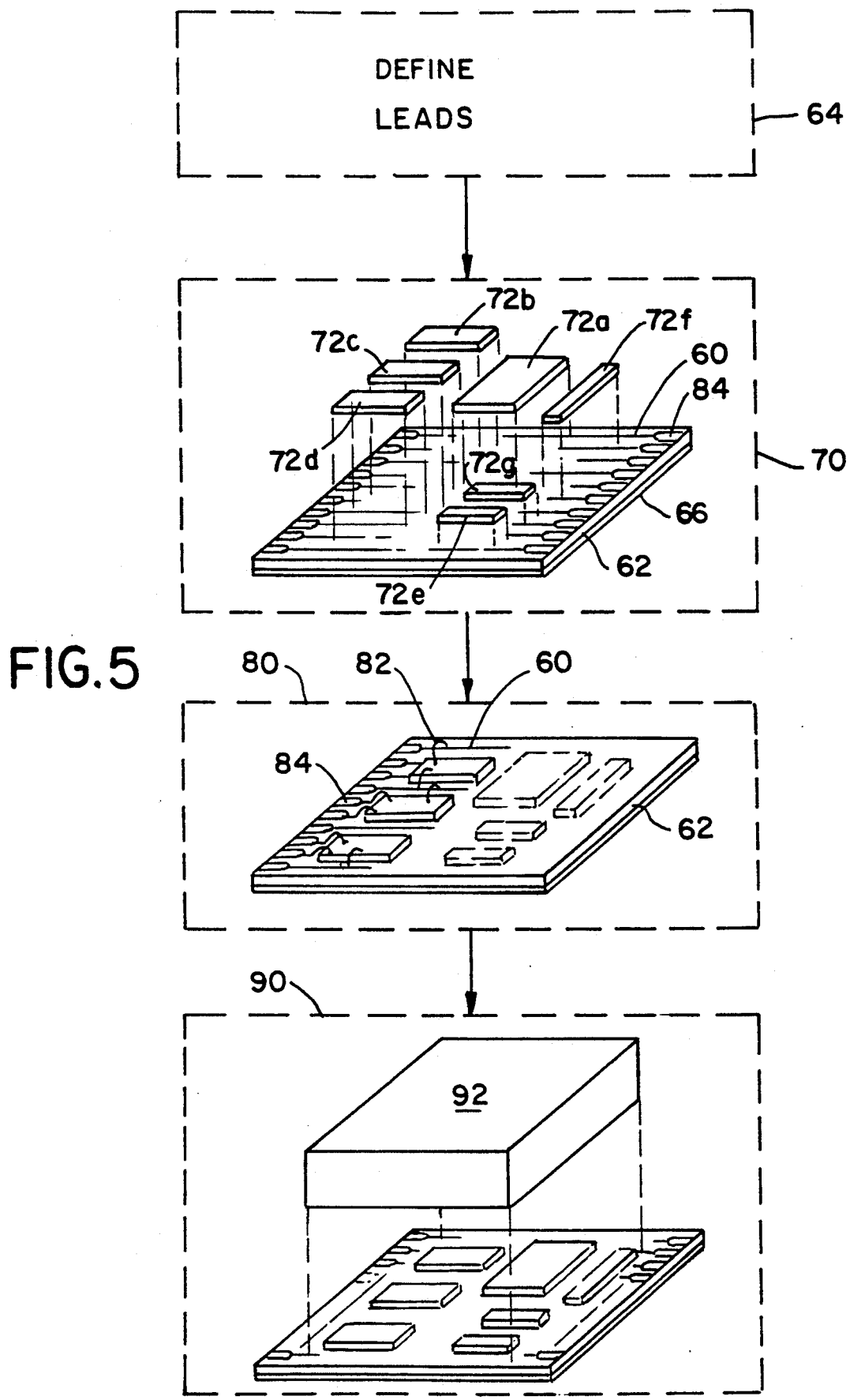

MAGNETIC RESONANCE SCANNER WITH IMPROVED PACKAGING FOR CIRCUITRY WITHIN THE MAGNETIC FIELD

BACKGROUND OF THE INVENTION

The present invention relates to the art of processing information within magnetic fields. It finds particular application in conjunction with amplifiers for radio frequency pick-up coils in magnetic resonance imaging apparatus and will be described with particular reference thereto. However, it is to be appreciated that the invention will also find application in conjunction with packaging for other circuitry positioned within the bore of magnetic resonance imaging and spectroscopy apparatus and the like.

Conventionally, patient encircling coils generate a static magnetic field through a patient examination region within their bore. Gradient magnetic field coils and RF coils are typically positioned concentrically within the static magnetic field coils, but outside the central examination region. The gradient magnetic field and radio frequency coils are controlled to generate corresponding gradient magnetic field and RF pulses for various magnetic resonance sequences, as is known in the art. Typically, the radio frequency coil can also be utilized to receive the relatively weak (as compared to the RF pulses of the magnetic resonance sequence) magnetic resonance signals emanating from the subject as a result of the magnetic resonance sequence.

For some imaging procedures, a surface radio frequency coil is positioned within the examination region, typically firmly against a surface of the subject. This places the coil for receiving the magnetic resonance signals much closer to assist in receiving weaker signals, to limit the region of the subject from which magnetic resonance signals are received, and the like. Typically, the signals from the surface coils are conveyed over nonferrous conductor cables to an amplifier located externally of the static magnetic field, typically a distance of a meter or more from the patient. The lead, to a certain extent, functions as an antenna for picking up unwanted signals and noise which the external amplifier amplifies along with the relatively weak magnetic resonance signals.

Placing the amplifier on the surface coil could raise the amplitude of the magnetic resonance signal several orders of magnitude above the noise picked up on the cable. However, conventionally available circuit components include ferrous materials which distort the magnetic field. Because surface coils are positioned very close to the examined region of interest, any ferrous components can cause unacceptably large distortions in the static magnetic field and the resultant image.

Readily available circuit components, such as diodes, transistors, microprocessors, and the like include steel in their packaging. More specifically, the lead wires and connectors are typically fabricated of steel. High quality components with "gold" leads actually have gold plated steel leads.

Having a component developed which includes no steel or nickel in its packaging is a time consuming and expensive undertaking. Many component companies are unwilling to invest the time and resources necessary to develop non-ferrous packaging for the components. Those suppliers which will, require long lead times, typically on the order of 3-9 months. Moreover, the components which are supplied are several hundred times more expensive than their steel packaged counterparts.

In high volume consumer electronics applications, where small size is very important, chip and wire hybrid, chip on board, tape automated bonding, flip chip, and other technologies have been utilized. In these technologies, the active and other components of a given circuit are adhered directly to a circuit board or substrate without being encased in a steel or other housing. Appropriate whiskers or other electrical interconnections are provided and the entire package is encapsulated in epoxy. Due to developmental costs, the use of these circuits is limited to less cost-sensitive applications. Even in high volume applications, these technologies are rarely utilized unless small size is important. Due to the low volume of surface coils and the relatively large number of surface coil models which each would require a different amplifier circuit, these technologies have been considered inappropriate for magnetic resonance scanners.

Moreover, the circuit boards used in some of these technologies such as chip-on-board technology, like other circuit boards, include an epoxy fiberglass or polyamide substrate which is laminated with copper which is etched away to form appropriate circuit leads. A nickel flash is applied to the copper followed by gold plating. Nickel, however, is sufficiently ferro-magnetic to cause significant distortions in the static magnetic field in the region of interest of the subject.

Rather than standard circuit boards, wiring patterns can be drawn on ceramic substrate with gold ink and fired. This technique is generally used for prototyping or in less cost-sensitive applications. Thin film sputtering and etching can also be used to manufacture gold film on ceramic boards.

The present invention contemplates a new and improved technique which enables active components such as diodes, transistors, and integrated circuits to be mounted directly on surface coils and other components which are mounted within the examination region of a magnetic resonance apparatus.

SUMMARY OF THE INVENTION

In accordance with the present invention, a surface coil for a magnetic resonance scanner is provided in which active circuit components without casings are mounted on the surface coil.

In accordance with another aspect of the present invention, a magnetic resonance apparatus is provided in which chip and wire hybrid technology is used to provide active circuit components of circuitry mounted within the examination region.

In accordance with a yet more limited aspect of the present invention, the circuitry formed by this technology includes a radio frequency amplifier and is formed on a circuit board which is devoid of iron, nickel, and other metals which distort or adversely affect the magnetic field in the examination region.

In accordance with another aspect of the present invention, the circuitry includes an array of commonly used components which are connectable to leads or contacts rather than being interconnected into a fixed circuit configuration. The array of components includes the components necessary to build substantially any of a plurality of circuits that are commonly placed in the examination region of a magnetic resonance apparatus such that one "universal" package can be reconfigured to a variety of applications.

One advantage of the present invention is that it enables circuitry to be placed within the magnetic field, particularly within the examination region of a magnetic resonance apparatus.

Another advantage of the present invention is that it reduces costs relative to custom packaging and dedicated custom chips.

Another advantage of the present invention is that it reduces component acquisition time and makes components which are suitable for use in magnetic fields more readily available.

Another advantage of the present invention resides in its wide variety of applications and ability to adapt for use in future generations of the product.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

FIG. 5 illustrates a method of manufacture.

DETAILED DESCRIPTION OF THE PREFERRED EMBODIMENTS

Figure 1:
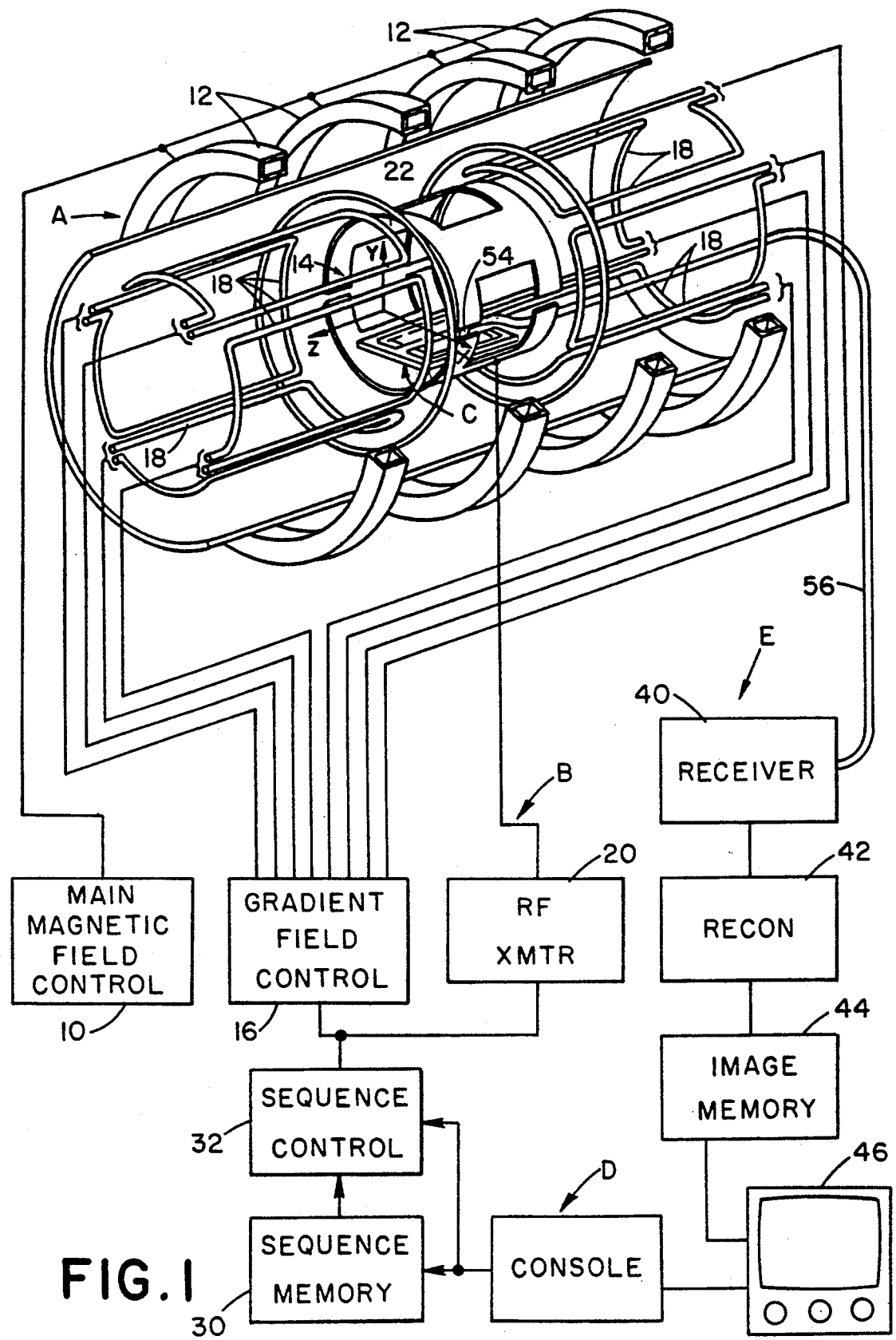
FIG. 1 is a diagrammatic illustration of a magnetic resonance imaging apparatus in accordance with the FIG. 2 illustrates a surface coil incorporating active circuit components in accordance with the present invention.

With reference to FIG. 1, a magnetic resonance imaging apparatus includes a main magnetic field means A for establishing a static, uniform magnetic field longitudinally through an examination region along a z-axis. The magnetic field means selectively produces magnetic field gradients orthogonally across and along the main magnetic field of the examination region. A magnetic resonance excitation means B excites magnetic resonance in selected nuclei of a subject disposed in the examination region. The resonating nuclei generate radio frequency magnetic resonance signals which are received by a surface or localized coil C. More specifically, the surface coil is disposed in the examination region firmly against a surface of the subject near the region of interest within the subject such that it receives magnetic resonance signals from nuclei disposed in the region of interest. A control console or means D is controlled by an operator to cause one of a plurality of magnetic resonance sequences to be implemented. Electronic processing circuitry E converts the received magnetic resonance signals into an image representation indicative of nuclei density, relaxation time, position, nuclei characteristics, or the like.

The main magnetic field means A includes a magnetic field controlled circuit 10 and a plurality of high power superconducting or resistive magnets 12. The field control circuit 10 controls the magnets 12 such that a uniform magnetic field is generated through an examination region 14 in a central core thereof. A gradient magnetic field means includes a gradient magnetic field control circuit or means 16 which applies current pulses to gradient coils 18 to create gradients, preferably linear gradients, across the main magnetic field in the examination region. Preferably, the gradient magnetic field control circuit causes linear gradients to be applied along each of three orthogonal x, y, and z-axes.

The resonance excitation means B includes a radio frequency transmitter 20 and an RF coil 22 to broadcast radio frequency (RF) signals that excite and manipulate magnetic resonance of dipoles of the subject within the examination region. The RF coil 22, in some modes of operation, is also used to receive magnetic resonance signals emanating from the examination region. In other modes of operation, the localized coil C is connected with a transmitter to apply the RF pulses to adjacent regions of the subject.

The control console D enables the operator to select among a plurality of magnetic resonance sequences and modes of operation. To select among different imaging sequences, the operator control console causes an electronic description of a selected magnetic resonance sequence to be withdrawn from a sequence memory 30 and loaded into a sequence control circuit 32. The sequence control circuit 32 causes the gradient field and RF pulses to be applied in accordance with the selected magnetic resonance sequence.

Magnetic resonance signals picked up by the localized coil C or the RF coil 22 are conveyed to a radio frequency receiver 40. Preferably, the receiver 40 is a digital receiver that receives and digitally demodulates the magnetic resonance signals. Demodulated signals from the receiver are conveyed to the electronic processing circuitry E. A reconstruction means 42 reconstructs image representations from the received magnetic resonance signals. If the magnetic resonance signals are not digitized an analog-to-digital converter is provided for digitizing the magnetic resonance signals before they are transferred to the reconstruction means 42. This enables the reconstruction means 42 to be embodied in a suitably programmed digital computer for implementing a two-dimensional inverse Fourier transform or other conventional reconstruction process. The reconstructed image representations are stored in an image memory 44 and selectively displayed on a video monitor 46. Optionally, the image representations may be subject to further processing, archived to disk for long-term storage, or the like.

Figure 2:
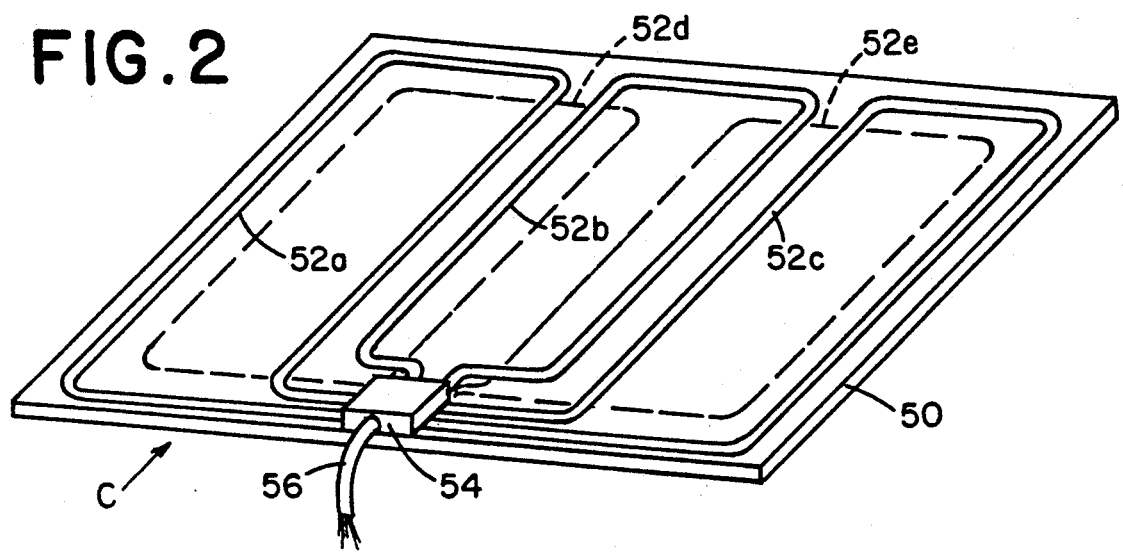

With reference to FIG. 2, the localized coil C includes a substrate 50 of a non-ferrous, non-conductive material. The substrate may be a rigid material, e.g. a fiberglass reinforced epoxy material or flexible, e.g. a polyamide film. A plurality of non-ferrous circuit coil segments 52 are mounted on the substrate. The coil segments may be etched from continuous circuit board material, may be thin films applied to the substrate, discrete electrical conductors, or the like. In the illustrated embodiment, three generally rectangular loop segments 52a, 52b, and 52c are illustrated on a top surface of the substrate. However, it is to be appreciated that the localized coil may include a larger number of loops of different shapes and configurations, including loops on an opposite surface of the substrate 50 such as loops 52d and 52e. An on-coil resonance signal processing circuit 54 selectively performs one or more of a plurality of magnetic resonance signal processing functions including amplifying magnetic resonance signals from each of the coils sections, selectively interconnecting the coil segments in different combinations, selectively causing different coil segments to be active, digitizing signals received the coil segments, multiplexing magnetic resonance signals received by different coil segments or coil segment combinations, and the like. The processed signals are carried on a lead 56 to the receiver 40.

Figure 3:
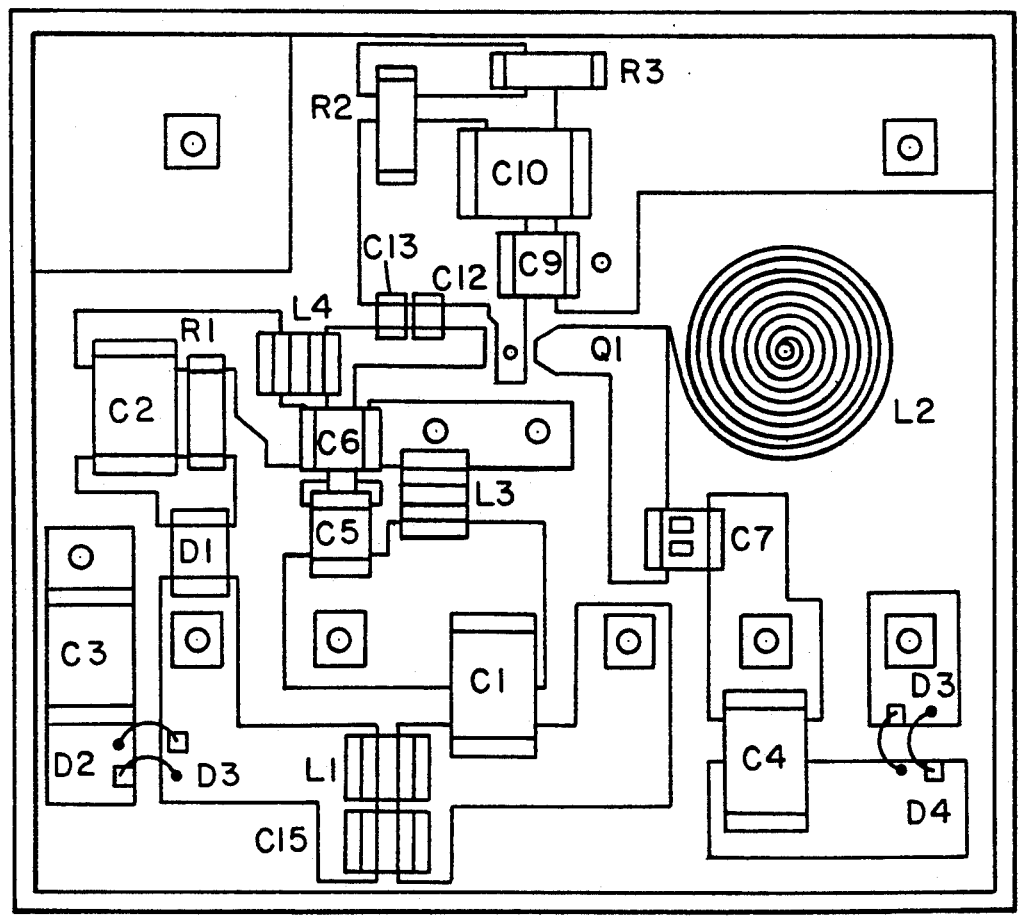
FIG. 3 is a top diagrammatic view of a preferred coil mounted amplifier.
Figure 4:
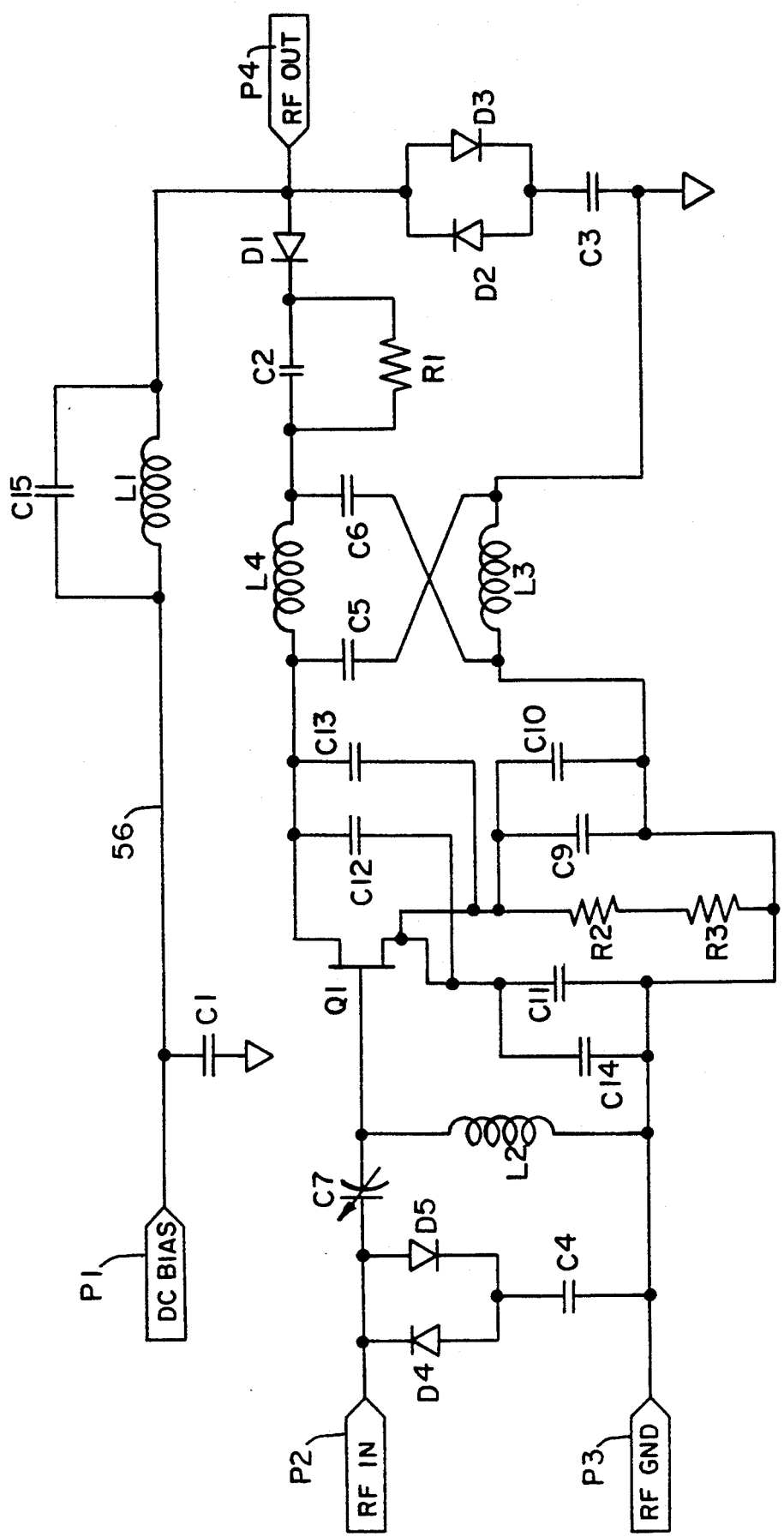
FIG. 4 is a circuit diagram of the amplifier of FIG. 3.

With reference to FIGS. 3 and 4, signals from the coil segments are received at pins P2, P3. Diodes D4 and D5 short high power RF signals, particularly the RF excitation signals which are applied by RF coil 22. Capacitor C7 and inductor L2 provide a tuned or resonance circuit, at the magnetic resonance frequency. A transistor Q1 amplifies the received magnetic resonance signals. The output of the transistor Q1 is connected through a tuned circuit for maximum signal transfer to an output pin P4 and the lead 56. Pin P1 is connected with lead 56 to receive a DC bias therefrom.

Each of the circuit components C1-C15, D1-D5, L1-L4, R1-R3, and Q1 are unjacketed, components with no steel, nickel, or other ferrous portions or leads. Electrical leads, particularly a gold film or ink, are silk-screened on the substrate 50. Gold whiskers are used to interconnect the components and leads into the circuit illustrated in FIG. 4. Preferably, a ceramic lid is sealed over the components of the processing circuit 54 for protection. Optionally, the components may be potted with epoxy, shielded with an aluminum lid, shielded with a plated, non-conductive lid, or the like. However, when potting the components, compensation should be made for the change in dielectric constants of the epoxy relative to air.

With reference to FIG. 5, leads 60 are defined on a substrate 62 in a lead and passive components defining step 64. In a preferred embodiment, the lead and passive components defining step 64 includes silk-screening a selected lead pattern onto the substrate 62 and firing the substrate. Alternately, the lead lines may be drawn in gold ink with a computer controlled pen. Other techniques include thin film sputtering, green film, and other known techniques. Analogous steps may also be used in a multilayer technique to define thick film resistors, inductors, and capacitors.

In an adhering step 70, component dice, i.e. components without packaging, are stuck to the substrate 62 and appropriate lead lines 60 with conductive epoxy or solder eutectic. In the illustrated embodiment, diodes D1-D5 and transistor Q1 are bonded in this manner. Capacitors, inductors, resistors, and other discrete parts can be attached in this manner or can be adhered with solder paste followed by a subsequent reflow or soldering operation, rather than being deposited in the passive circuit component and lead line defining step 64.

Preferably, the lead defining step 64 further includes depositing a ground layer 66 to shield the circuit components or to provide a common ground. Optionally, multiple layers of leads may be provided separated by insulating layers, particularly where capacitors are defined with the lead lines. In an alternate embodiment, the component die array includes a mix of active component dice which are interconnectable to form a variety of processing circuits, e.g. a microprocessor 72a, a plurality of amplifiers 72b, an array of switching transistors 72c, an array of diodes 72d (preferably including at least some PIN diodes), a multiplexer 72e, analog-to-digital converters 72f, buffers 72g, and other integrated circuits. Other components such as light emitting diodes for converting the output signal to an optical signal, capacitors, inductors, resistors, and the like are also contemplated.

In a wire bonding step 80, the active components are electrically connected to the lead lines 60. Preferably, gold whiskers 82 are pressure bonded, welded, or otherwise connected to the appropriate layers of the component die and with the electrical leads 60.

Optionally, a lead connecting step is performed to connect non-ferrous electrical leads or pins with each lead lines 60 to enable the resultant construction to be inserted into a conventional or custom designed socket. The pins may be plated with gold or other corrosion resistant materials. Alternately, contact points 84 may be defined in the lead lines at the edges of the substrate or other means may be provided for facilitating interconnection with associated circuitry.

In an encasing step 90, the construction is sealed in a ceramic shell 92, encased in epoxy or other suitable polymers and cured, or the like for protection. Preferably, the shell is coated with a non-ferrous metal for shielding.

In the alternate embodiment, component dice are not interconnected with each other in operative circuits. Rather, such interconnection is uniquely selected in accordance with the localized coil or other in-magnetic field application with which the circuit component is to be utilized. For example, in the FIG. 2 coil, each of the five loops 52a-52e can be connected by transistors of the switching transistor array 72c with amplifiers 72b. Additional transistors of the array can connect the amplifier outputs with the multiplexer 72e. The microprocessor 72a can control the multiplexer and transistors to connect the outputs of the amplifiers cyclically with the analog-to-digital converter 72f. The analog-to-digital convertor may be connected by an additional amplifier of the amplifier array 72b with the cable 56 which connects the localized coil to the receiver 40. Other components can also be provided such as laser diodes, integrated circuits, mixers for mixing the signal with a carrier, and the like.

The operator on the console D may select other modes of using the localized coil. Control signals and electrical power are conveyed along conductors of cable 56 to cause the microprocessor 72a to change the state of various transistors in the transistor array 72c. For example, the transistors can connect coil segments into different combinations, e.g. in series with each other. In another mode, the transistor array 72c can connect all of the surface coil segments 52a-52e in parallel, such that all five act in unison as a single localized coil. Other combinations of coil segments and other modes of interconnecting them are also contemplated.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. In a magnetic resonance apparatus which includes a means for creating a magnetic field through an examination region; a means for exciting nuclei of a subject with int he examination region to emit radio frequency magnetic resonance signals; a radio frequency receiving coil means disposed in the examination region for receiving the magnetic resonance signals, the coil means including: an insulating substrate; at least one coil segment supported by the insulating substrate; a magnetic resonance signal processing circuit; a radio receiver for receiving magnetic resonance signals from the resonance signal processing circuit, the receiver means being disposed outside of the examination region; a data reconstruction means operatively connected with the receiver means for processing the received data; a memory means for storing the processed data for selected display on a video monitor; THE IMPROVEMENT COMPRISING:

constructing the magnetic resonance signal processing circuit using chip and wire hybrid technology in which a plurality of ferrous-free unpackaged dice are mounted and bonded to a semiconductor substrate having electrical lead lines defined thereon, the dice are wire bonded by whiskers bonded directly to electrically conductive layers of the dice and the substrate lead lines.

2. The apparatus as set forth in claim 1 further including a ceramic housing for protecting the signal processing circuit.

3. The apparatus as set forth in claim 1 wherein the signal processing circuit further includes a polymeric potting material for protecting the unpackaged dice.

4. The apparatus as set forth in claim 1 wherein the signal processing circuit includes an unpackaged transistor die interconnected to function as an amplifier.

5. The apparatus as set forth in claim 1 wherein the signal processing circuit includes dice wired to the substrate lead lines and transistor dice wired to the substrate lead lines to define an amplifier.

6. The apparatus as set forth in claim 1 wherein the signal processing circuit includes unpackaged diode and transistor dice.

7. A magnetic resonance apparatus comprising:
a means for creating a magnetic field through an examination region;
a means for exciting nuclei of a subject within the examination region to emit radio frequency magnetic resonance signals;
a radio frequency receiving coil means disposed in the examination region for receiving the magnetic resonance signals, the coil means including at leas one coil segment and a magnetic resonance signal processing circuit constructed using chip and wire hybrid technology, the signal processing circuit including:
a substrate having lead lines defined thereon,
a plurality of ferrous-free dice bonded to the substrate, the dice including unpackaged microprocessor, diode, and transistor dice;
metal whiskers for wire bonding the dice to the substrate, the whiskers being bonded to the substrate lead lines and to electrically conductive portions of the microprocessor, diode, and transistor dice;
a radio receiver for receiving magnetic resonance signals form the resonance signal processing circuit, the receiver means being disposed outside of the examination region;
a data reconstruction means operatively connected with the receiver means for processing the received data;
a memory means for storing the processed data for selected display on a video monitor.

8. The apparatus as set forth in claim 7 wherein the signal processing circuit further includes multiplexer, and analog-to-digital convertor dice.

9. The apparatus as set forth in claim 7 wherein the signal processing circuit further includes a plurality of switching transistor dice for switching the microprocessor, diode, and transistor dice into each of a plurality of circuit configurations; and,
further including an operator control means disposed outside of the examination region and electrically connected with the processor die to control the switching transistor dice to switch the microprocessor, diode, and transistor dice among selected circuit configurations.

10. A receiving coil which is configured to be received within an examination region of a magnetic resonance apparatus for receiving radio frequency resonance signals emanating from an adjacent subject in the examination region, the receiving coil comprising:
an insulating sheet;
at least one coil segment supported by the insulating sheet;
a magnetic resonance signal processing circuit mounted on the insulating sheet and connected with the coil segment for processing signals received by the coil segment, the signal processing circuit including:
a substrate,
lead lines defined on the substrate,
a plurality of ferrous-free unpackaged dice including unpackaged diode, transistor, and microprocessor dice, mounted to the substrate and electrically connected to the lead lines.

11. The coil as set forth in claim 10 wherein the insulating sheet is a flexible polymeric material.

12. The coil as set forth in claim 10 wherein the insulating sheet is a rigid electrically insulating material.

13. The coil as set forth in claim 10 further including a shielded housing affixed over the signal processing circuit.

14. A receiving coil which is configured to be received within an examination region of a magnetic resonance apparatus for receiving radio frequency resonance signals emanating from an adjacent subject in the examination region, the receiving coil comprising:
a polymeric material;
at least one coil segment supported by the polymeric material;
a magnetic resonance signal processing circuit mounted on the polymeric material and connected with the coil segment for processing signals received by the coil segment, the signal processing circuit including:
a substrate,
lead lines defined on the substrate,
a plurality of ferrous-free unpackaged dice mounted to the substrate and electrically connected to the lead liens, and
a shielding conductive layer on at least one of the substrate and a protective covering.

15. The coil as set forth in claim 14 wherein the signal processing circuit includes at least one transistor die which is wire bonded to the lead lines and wherein the lead lines are connected with the at least one coil segment such that the transistor die amplifies radio frequency signals received thereby.

16. The coil as set forth in claim 14 wherein the signal processing circuit includes a microprocessor die, transistor dice, and diode dice.

* * * * *